(12) United States Patent
Ono et al.

(10) Patent No.: US 6,735,231 B2
(45) Date of Patent: May 11, 2004

(54) SEMICONDUCTOR LASER DEVICE

(75) Inventors: Tomoki Ono, Nara (JP); Shigetoshi Ito, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/037,999

(22) Filed: Nov. 9, 2001

(65) Prior Publication Data

US 2002/0181527 A1 Dec. 5, 2002

(30) Foreign Application Priority Data

Nov. 10, 2000 (JP) ........................................ 2000-343189

(51) Int. Cl.[7] ................................................. H01S 5/00
(52) U.S. Cl. ........................................... 372/45; 372/43
(58) Field of Search ............................ 372/45, 44, 46, 372/50, 20

(56) References Cited

U.S. PATENT DOCUMENTS

| 5,225,692 | A | * | 7/1993 | Takeuchi et al. | ............... 257/17 |
| 5,581,570 | A | * | 12/1996 | Yoshida et al. | ............... 372/46 |
| 5,751,756 | A | * | 5/1998 | Takayama et al. | ............ 372/46 |
| 5,937,274 | A | * | 8/1999 | Kondow et al. | .............. 438/47 |
| 6,014,394 | A | * | 1/2000 | Tomita | ......................... 372/45 |
| 6,456,640 | B1 | * | 9/2002 | Okumura | ..................... 372/46 |
| 6,563,850 | B1 | * | 5/2003 | Matsumoto et al. | .......... 372/45 |

FOREIGN PATENT DOCUMENTS

| JP | 9-191160 | 7/1997 |
| JP | 10-294532 | 11/1998 |

* cited by examiner

*Primary Examiner*—Paul Ip
*Assistant Examiner*—Dung T Nguyen
(74) *Attorney, Agent, or Firm*—Morrison & Foerster LLP

(57) ABSTRACT

A semiconductor laser device includes an active layer and a layer greater in bandgap energy than the active layer and having a stacked-layer structure mainly of gallium-nitride-based semiconductor for lasing. This device includes a gallium-nitride-based semiconductor layer substantially equal in bandgap to the active layer and containing at least one element selected from the group consisting of As, P and Sb for saturable absorption at a location apart from the active layer and inside the layer greater in bandgap energy than the active layer.

18 Claims, 13 Drawing Sheets

FIG. 2
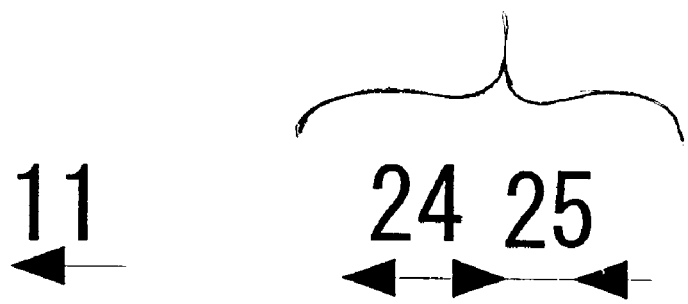
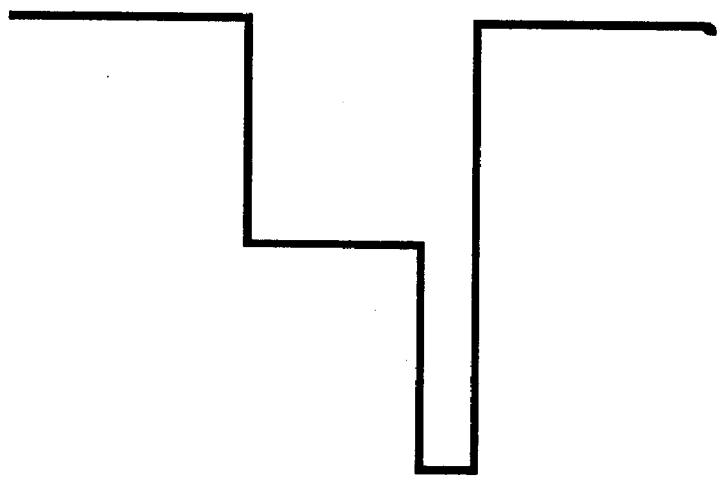

SEMICONDUCTOR LASER DEVICE

BACKGROUND OF THE INVENTION

1. Field of the Invention

The present invention relates to semiconductor laser devices and particularly to self-pulsing, low-noise semiconductor laser devices.

2. Description of the Background Art

Light of a short wavelength around 400 nm will be used for a light source in an optical disk apparatus of a next generation, because it makes it possible to reduce a focused light beam spot size and thus enables high-density recording. On the other hand, a lens, an optical disk and the like are formed with inexpensive plastic-based material to reduce their costs. Such plastic-based material has an absorption edge wavelength of about 390 nm. Therefore, if the wavelength of the light source is made too shorter than 400 nm, it becomes necessary to carefully consider material for the lens and the like and thus the too short wavelength would not be preferable for mass production of optical disk apparatus.

For a light source of a short wavelength of about 400 nm, semiconductor lasers are used, which are typically formed with gallium nitride compound semiconductor. For example, Japanese Patent Laying-Open No. 10-294532 discloses a semiconductor laser for an optical disk apparatus, which is formed with gallium nitride and has a structure as shown in FIG. 11. In FIG. 11, provided over a sapphire substrate 70 are an n-type GaN buffer layer 71, an n-type GaN contact layer 72, an n-type AlGaN clad layer 73, an adjacent n-type InGaN/GaN multiquantum well layer 74, an active InGaN/GaN multiquantum well layer 75, an adjacent p-type GaN layer 76, a p-type AlGaN clad layer 77, a p-type GaN contact layer 78, and an n-type GaN current barrier layer 79. Furthermore, a p side electrode 80 is provided on p-type GaN contact layer 78 and an n side electrode 81 is provided on n-type GaN contact layer 72 which is partially exposed by anisotropic etching. In this semiconductor laser, island regions 82 with high In concentration in adjacent layer 74 serve as saturable absorption regions for causing self-pulsation.

Japanese Patent Laying-Open No. 9-191160 discloses a semiconductor laser having an InGaN saturable absorption layer, structured as shown in FIG. 12. In FIG. 12, successively provided over an n-type SiC substrate 60 are an n-type AlN layer 61, an n-type AlGaN clad layer 62, an n-type GaN optical guide layer 63, an InGaN quantum well active layer 64, a p-type GaN optical guide layer 65, a p-type AlGaN clad layer 66, and a p-type GaN contact layer 67. Further, an InGaN saturable absorption layer 68 is provided inside p-type GaN optical guide layer 65. Furthermore, an n-type electrode 59 is provided on a back surface of substrate 60 and a p-type electrode 69 is provided on p-type contact layer 67.

Conventionally in an energy band structure of InGaN used for saturable absorption, heavy holes have large effective mass and its valence band has an upper portion of a large state density and thus there hardly occurs saturation of absorption regarding light from an active layer. As such, in a semiconductor laser having a suturable absorption layer of InGaN as described in Japanese Patent Laying-Open No. 9-191160, saturable absorption effect hardly occurs at low output and thus an output of a relatively high level is required to maintain self-pulsation. Therefore, if such a semiconductor laser is used as a light source for an optical disk, it is disadvantageous in its power consumption and its lifetime.

SUMMARY OF THE INVENTION

An object of the present invention is to provide a semiconductor laser having a good characteristic of self-pulsation even at low output.

To overcome the disadvantage as described above, the present inventors considered introducing a nitride-based semiconductor layer improved in composition for saturable absorption. As a result, it was found that a gallium-nitride-based semiconductor layer containing at least one element selected from the group consisting of As, P and Sb, can be used to cause saturable absorption and then to provide a semiconductor laser capable of self-pulsing at low output.

Specifically, according to the present invention, a semiconductor laser device has a stacked-layer structure mainly of gallium-nitride-based semiconductor for laser excitation and includes an active layer and a layer greater in bandgap energy than the active layer, wherein the device also includes a gallium-nitride-based semiconductor layer substantially equal in bandgap to the active layer and containing at least one element selected from the group consisting of As, P and Sb for saturable absorption at a location apart from the active layer and inside or in contact with the layer greater in bandgap energy than the active layer.

The gallium-nitride-based semiconductor can be, for example, GaN, $Al_xGa_{1-x}N$ ($0<x<1$), $In_xGa_{1-x}N$ ($0<x<1$), $In_xGa_yAl_{1-x-y}N$ ($0<x<1$, $0<y<1$), $Al_xIn_yGa_{1-x-y}N_{1-p-q-r}As_pP_qSb_r$ ($0\leq x$, $0\leq y$, $x+y<1$, $0\leq p$, $0\leq q$, $0\leq r$, $p+q+r<1$). While the stacked-layer structure in the semiconductor laser device of the present invention is formed mainly with such gallium-nitride-based semiconductor as described above, it can also include AlN, InN, InAlN and other similar III-V compound semiconductors, particularly III-N compound semiconductor.

In the present invention, it is preferable that the saturable absorption layer of gallium-nitride-based semiconductor containing at least one of As, P and Sb is formed with a quantum well structure. Furthermore in the present invention, the layer greater in bandgap energy than the active layer can be a clad layer or an optical guide layer.

Typically in the present invention, the saturable absorption layer is formed of gallium-nitride-based semiconductor represented by an expression $Al_xIn_yGa_{1-x-y}N_{1-p-q-r}As_pP_qSb_r$, wherein $0\leq x$, $0\leq y$, $x+y<1$, $0\leq p$, $0\leq q$, $0\leq r$, and $0.001\leq p+q+r\leq 0.5$. In the expression, preferably, $q+r=0$ and $0.005\leq p$, or $q+r=0$ and $0.006\leq q$. This is effective as it can provide a sufficient level of crystallinity for the saturable absorption layer.

It is preferable that the laser device of the present invention further includes an AlGaN layer covering the saturable absorption layer. Furthermore in the present invention, it is preferable that the stacked-layer structure of gallium-nitride-based semiconductor is provided on a GaN substrate.

Furthermore in the present invention, the saturable absorption layer can be lower in crystallinity than the layer greater in bandgap energy than the active layer. Generally, the saturable absorption layer is preferably grown at a lower temperature as compared with the layer greater in bandgap energy than the active layer.

The saturable absorption layer has, for example, a thickness of 0.1 nm to 50 nm, preferably 0.5 nm to 20 nm.

GaNAs, GaNP, GaNSb, GaNAsP and any other similar gallium-nitride-based semiconductor containing at least one of As, P and Sb, hereinafter referred to as "GaN (As, P, Sb)", contains heavy holes smaller in effective mass as compared with InGaN. Furthermore, in the energy band structure of GaN (As, P, Sb), the state density in the valence band is small in the vicinity of the band end. Therefore, when light slightly greater in energy than the substantial bandgap is absorbed, heavy hole saturation occurs more readily in GaN (As, P, Sb) than in InGaN. As such, if a semiconductor laser device includes a saturable absorption layer of GaN (As, P, Sb), it can self-pulse even at low output.

Such a laser can be applied for example to an optical disk system of low power consumption. Such an optical disk system essentially requires a semiconductor laser not only having high quantum efficiency but also self-pulsing even at low output and requires a photoelectric conversion device.

Furthermore, a semiconductor laser device capable of maintaining self-pulsation at higher output can be obtained by providing nitride-based semiconductor layers appropriate in structure, arrangement and number. Such a laser device allows images, sounds and other similar information to be steadily written in an optical disk system.

The foregoing and other objects, features, aspects and advantages of the present invention will become more apparent from the following detailed description of the present invention when taken in conjunction with the accompanying drawings.

BRIEF DESCRIPTION OF THE DRAWINGS

In the drawings:

FIG. 2 is a energy level diagram representing a nitride-based semiconductor layer for saturable absorption;

DESCRIPTION OF THE PREFERRED EMBODIMENTS

First Embodiment

Figure 1:
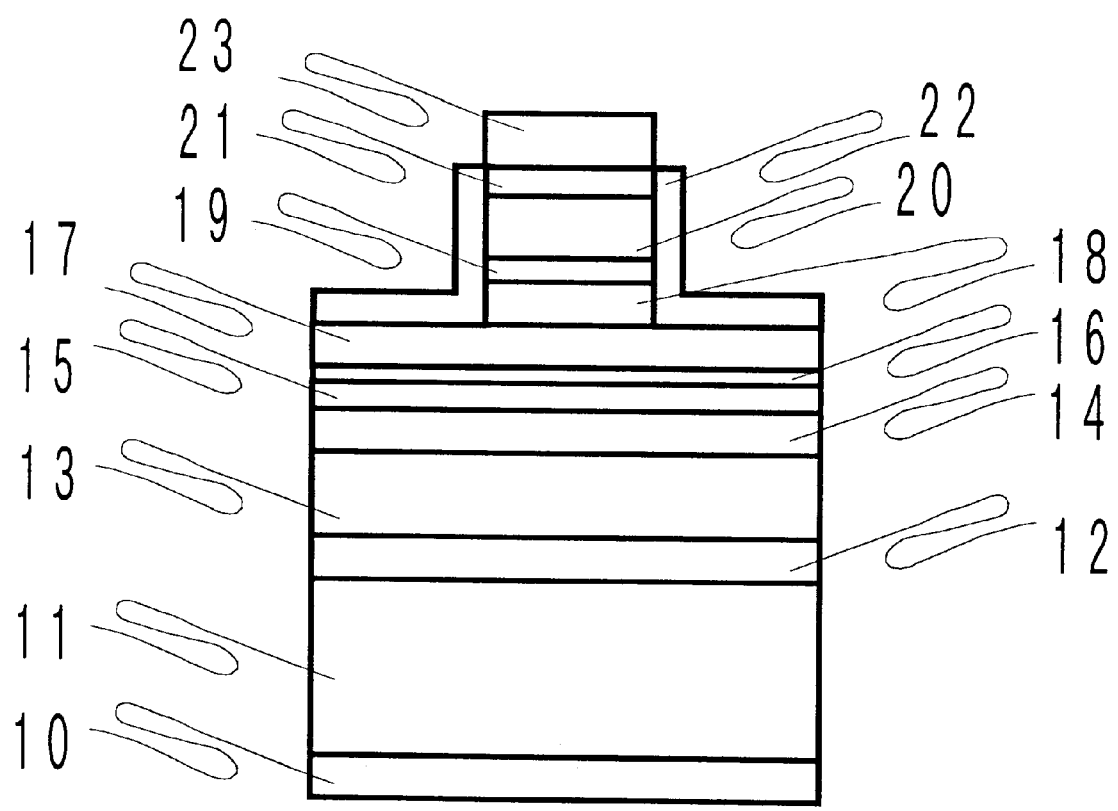
FIG. 1 schematically shows a semiconductor laser device of a first embodiment of the present invention.

FIG. 1 schematically shows a semiconductor laser device in a first embodiment of the present invention. In FIG. 1, a GaN substrate 11 has a back surface provided with an n electrode 10 and a front surface provided with an n-GaN buffer layer 12, an n-AlGaN clad layer 13, an n-GaN guide layer 14, a GaNAs active layer 15, an AlGaN antvaporization layer 16, a p-GaN guide layer 17, a p-AlGaN clad layer 18, a nitride-based semiconductor layer 19, a p-AlGaN clad layer 20, a p-GaN contact layer 21, an insulation film 22 and a p electrode 23 successively.

Furthermore, as shown in FIG. 1, a ridge structure is formed closer to the p electrode 23 and then electric current distribution introduced into the active layer 15 is controlled by current narrowing due to the ridge structure.

Nitride-based semiconductor layer 19 is now described more specifically with reference to FIG. 2. FIG. 2 schematically represents a lower limit level of a conduction band in nitride-based semiconductor layer 19. In the figure, there is shown a lower limit level of a conduction band in p-AlGaN clad layer 18, a p-GaN optical guide layer 24 and a p-GaNAs monoquantum well layer 25 included in nitride-based semiconductor layer 19 for saturable absorption, and p-AlGaN clad layer 20 in this order from the substrate 11 side. That is, nitride-based semiconductor layer 19 is formed of p-GaN optical guide layer 24 and p-GaNAs monoquantum well layer 25. Nitride-based semiconductor layer 19 has a small bandgap substantially equal to that of active layer 15 and further optical guide layer 24 efficiently confines light emitted from the active layer thereby to implement a structure facilitating absorption. Hereinafter reference will be made to FIG. 1 to describe a method of fabricating a semiconductor laser device of the first embodiment.

A structure of a semiconductor laser device according to the present invention is formed typically by an epitaxial growth method to grow a crystalline film on a substrate. The epitaxial growth method can be vapor phase epitaxy (VPE), chemical vapor deposition (CVD), organo-metallic vapor phase epitaxy (MOVPE), organo-metallic chemical vapor deposition (MOCVD), halide-VPE, molecular beam epitaxy (MBE), organo-metallic molecular beam epitaxy (MOMBE), gaseous source molecular beam epitaxy (GSMBE), chemical beam epitaxy (CBE), or the like.

Figure 10:
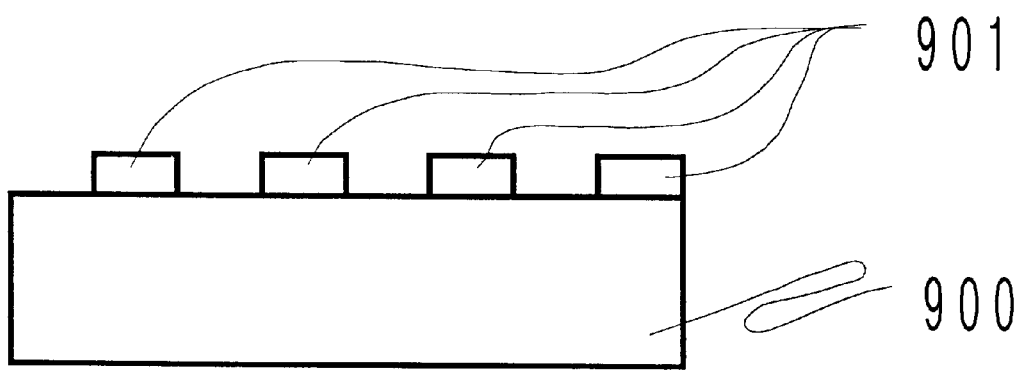
FIG. 10 schematically illustrates a step of providing a GaN substrate.
Figure 11:
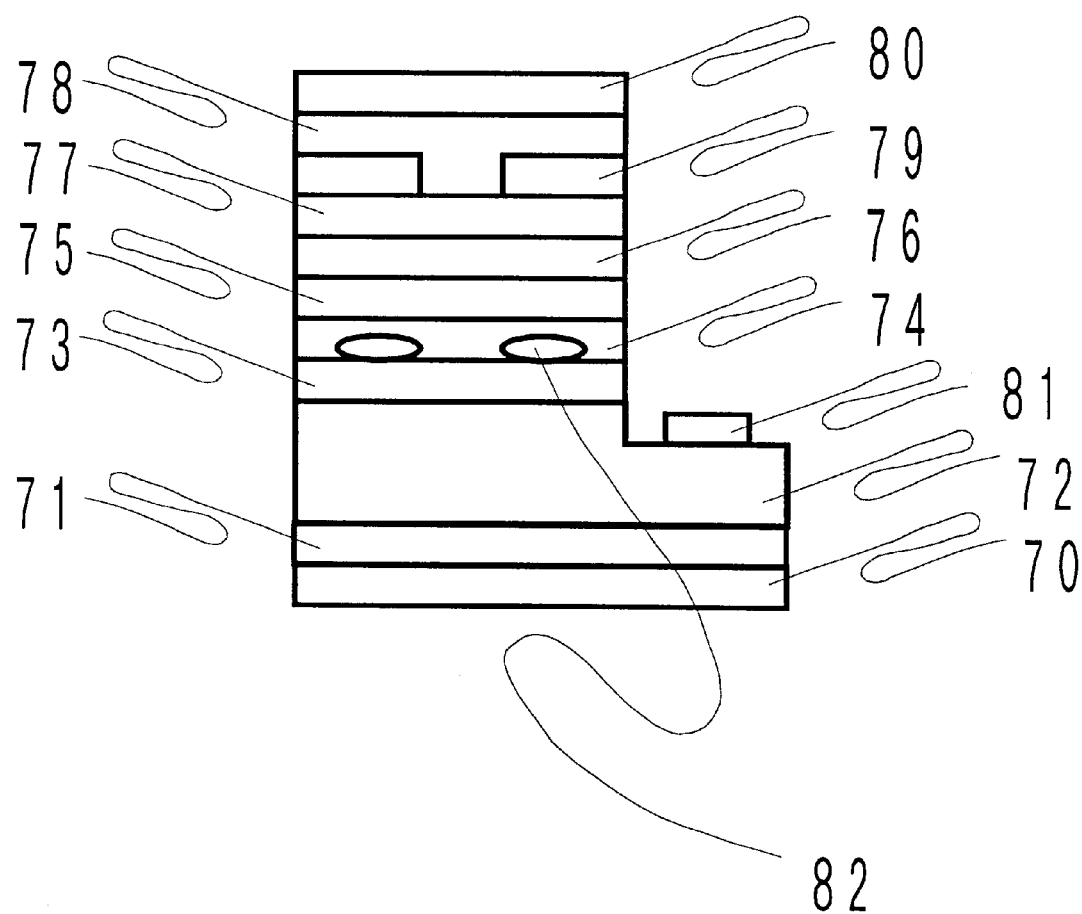
FIG. 11 schematically shows a conventional semiconductor laser.
Figure 12:
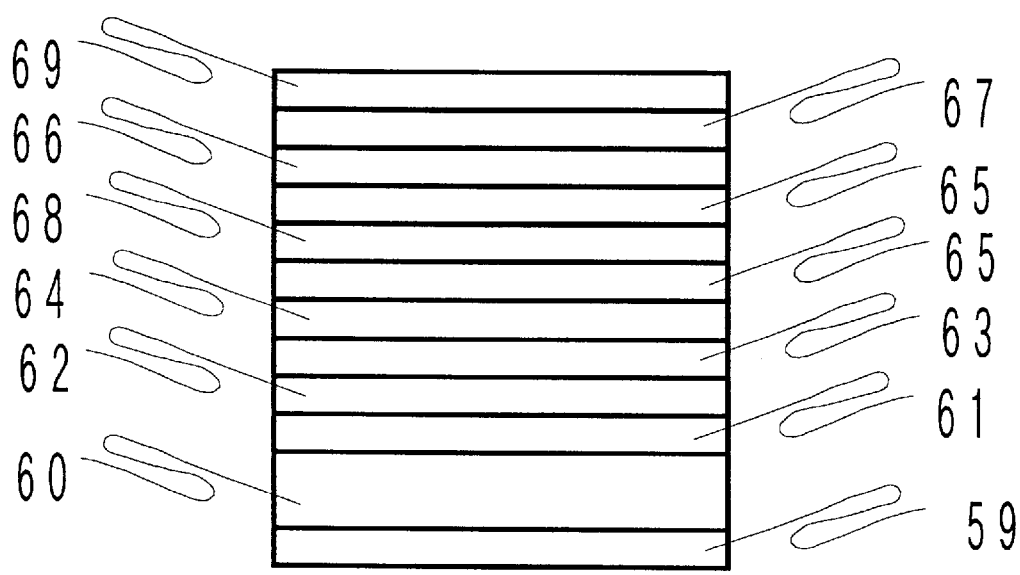
FIG. 12 schematically shows another conventional semiconductor laser.

Initially GaN substrate 11 is prepared, as follows. As shown in FIG. 10, a $SiO_2$ film 901 having periodic openings is formed on a major surface of sapphire substrate 900 having a diameter of 5.08 cm or two inches and a thickness of about 350 μm. Sapphire substrate 900 is placed in an epitaxial growth apparatus and then in a flow of $H_2$ it is thermally cleaned at a temperature of about 1100° C. Then Ga containing gas is prepared by supplying, to a metal Ga held at about 700° C. at a different location in the same epitaxial growth apparatus, gaseous HCl of 100 cc per minute serving as a carrier transporting a source material Ga and $H_2$ of 1000 cc per minute serving as a carrier gas. The Ga containing gas, $NH_3$ of 2000 cc per minute for a source material N, an n-type gaseous impurity of $SiH_4$ and a carrier gas of $H_2$ of 10000 cc per minute are mixed together and supplied on sapphire substrate 900 at 1050° C. to grow a GaN monocrystalline film for three hours. A GaN monocrystalline film thus obtained is of a thickness of about 500 μm. In this process, sapphire substrate 900 has thereon $SiO_2$ film 901 having periodical openings so that even when the GaN monocrystalline film having the relatively large thickness of about 500 μm grown on the sapphire substrate may not cause cracking. Furthermore in this process, since Si is introduced simultaneously with the crystal growth, a thick GaN monocrystalline film of an n-conductivity type is obtained. In the present process, such an epitaxially grown GaN buffer layer as provided in a known epitaxy may be provided in advance between sapphire substrate 900 and $SiO_2$ film 901. Although the fabrication process of this method becomes somewhat complicated, a GaN monocrystalline film of a higher quality can be obtained.

Then a surface of the GaN monocrystalline film is lapped by about 10 μm to resolve thickness unevenness that have been introduced during the crystal growth step. Then a grinder having a grindstone containing diamond particles of about #400 grain size, is used to grind sapphire substrate 900 to reduce its thickness to about 100 μm. Then a slurry containing diamond particles of about 15 μm grain diameter, is used to lap and completely remove the sapphire base. Subsequently, the GaN monocrystailine film is ground using a plurality of types of slurry containing diamond particles successively reduced in diameter and finally having a diameter of about ½ μm. By grinding the GaN monocrystalline film by at least 50 μm, preferably at least 100 μm, mechanical strain can be substantially removed and a region containing many crystal defects introduced during initial crystal growth can also be removed. Then a slurry of diamond having a further smaller grain size is used to polish the wafer to remove scratches therefrom to provide a mirror-finished surface.

Then to remove defects resulting from the process, an alkaline $SiO_2$ slurry is used to mechano-chemically polish the wafer to obtain a surface flatten on the order of Å for crystal growth thereon. Alternatively, mechano-chemical polishing with a KOH solution also bring about a satisfactory result. Successively employing the both of the above mechano-chemical polishing steps also bring about a satisfactory result. As described above, n-GaN substrate 11 (of two inches in diameter and about 400 μm in thickness) is obtained.

Then each gallium-nitride-based semiconductor layers are epitaxially grown on GaN substrate 11, as follows. Initially in a MOCVD apparatus, GaN substrate 11 is set and at a relatively low temperature of 500° C. a low-temperature GaN buffer layer is grown to a thickness of 25 nm using $NH_3$ for a source material for a group V element and trimethylgallium (TMGa) for a source material for a group III element. Then at a temperature of 1050° C., $NH_3$ and TMGa plus $SiH_4$ are introduced to form n-GaN layer 12 (having an impurity Si content of $1 \times 10^{18}/cm^3$) to 3 μm thickness. Then the temperature is reduced to about 700 to 800° C. and trimethylgallium indium (TMIn) for a source material for a III element is supplied to grow an n-$In_{0.07}Ga_{0.93}N$ crack prevention layer of 40 nm thickness. Again the substrate temperature is increased to 1050° C. and trimethylaluminum (TMAl) for a source material for a III element is used to grow a 0.8 μm thick n-$Al_{0.1}Ga_{0.9}N$ clad layer 13 (having an impurity Si content of $1 \times 10^{18}/cm^3$) and subsequently grow n-GaN guide layer 14 to 0.1 μm thickness. Then the substrate temperature is reduced to 800° C. and three periodic $GaN_{0.98}As_{0.02}$ well layers of each 4 nm thickness and four $In_{0.05}Ga_{0.95}N$ barrier layers of each 6 nm thickness are grown to form light emission layer 15 (having a multiquantum well structure) by stacking a barrier layer, a well layer, a barrier layer, a well layer, a barrier layer, a well layer and a barrier layer in this order. The crystal growth may have an intermission of 1 to 180 seconds between barrier and well layers or between well and barrier layers. This allows each layer to be flatter and a resultant laser device can emit light with a reduced half-width.

Then the substrate temperature is increased again to 1050° C. to grow 20-nm p-$Al_{0.2}Ga_{0.8}N$ barrier layer 16, 0.1-μm p-GaN guide layer 17 and 0.3-μm p-$Al_{0.1}Ga_{0.9}N$ clad layer 18. In doing so, a p-type impurity of Mg is added with a concentration of $5 \times 10^{19}/cm^3$ to $2 \times 10^{20}/cm^3$.

Then the substrate temperature is reduced to about 800° C. to successively grow 10-nm p-GaN optical guide layer 24 and 2-nm p-GaNAs monoquantumn well layer 25 included in nitride-based semiconductor layer 19. Monoquantumn well layer 25 has a composition of approximately $GaN_{0.97}As_{0.03}$. Nitride-based semiconductor layer 19 formed of layers 24 and 25 contains a p-type impurity of Mg introduced therein to reduce carrier lifetime and it is also grown at a relatively low temperature to have crystalinity impaired as appropriate.

Again the substrate temperature is increased to 1050° C. to grow 0.2-μm p-$Al_{0.1}Ga_{0.9}N$ clad layer 20 and 0.1-μm p-GaN contact layer 21.

As described above, TMGa, TMAl, TMIn, $NH_3$, $AsH_3$, biscyclopentadienylmagnesium ($CP_2Mg$), and $SiH_4$ are used as source materials for elements constituting the compound semiconductor layers and dopants. Active layer 15 and monoquantumn well layer 25 in nitride-based semiconductor layer 19 are formed with 1 to 8 atomic % As set by adjusting the growth temperature, the gas pressure, and the like. Active layer 15 and nitride-based semiconductor layer 19 have their bandgaps adjusted to be substantially equal to each other so that in photoluminescence (PL) measurement, they have only a difference in PL emission peak wavelength within ±20 nm (±0.15 eV).

After p-GaN contact layer 21 is formed, a dry etching step is used to form a ridge structure and then p electrode 23 of Pd/Au is formed on an opening part of insulation film 22. Then, the back surface of GaN substrate 11 is polished or etched to partially remove a part of the substrate and thus adjust the thickness of the wafer to be thin as about 100 to 150 μm. This step is provided to facilitate a subsequent step for dividing the wafer into individual laser chips. In particular, if end face mirrors of a laser resonator is formed when a wafer is divided into chips, substrate 11 is preferably adjusted to have a small thickness as about 80 to 120 μm. In the present embodiment, a grinder and a polishing machine can be used to adjust the wafer to have a thickness of 100 μm, for example. The polishing machine alone may be used to do so. The back surface of the wafer is polished by the polishing machine and thus flat.

After the wafer is polished, a thin metal film is deposited on a back surface of GaN substrate 11 to obtain n electrode 10 having a Hf/Al/Mo/Au layered structure. Vacuum vapor deposition is suitable for forming such a thin metal film with good thickness control, and it can preferably be used in the present embodiment. It is needless to say, however, that ion-plating, sputtering and other similar techniques may also be used. To improve characteristics of the p and n electrodes, formation of the metal films is followed by annealing at 500° C. to obtain good ohmic electrodes.

A wafer with semiconductor devices fabricated as described above is divided into chips, as follows. A diamond point is initially used to form scribing lines on the back surface of substrate 11 and then an appropriate level of force is applied to the wafer to divide it along the scribing line. Alternatively, the wafer can also similarly be divided into chips by using a wire-saw or a thin plate blade to scratch or cut the wafer to dice it, by using excimer laser or the like to direct a laser beam to heat the wafer and then rapidly cooling the wafer to cause a crack as a scribing line at the irradiated portion, or by directing a laser beam of a high energy density to vaporize and thus abrase a portion of the wafer to form a groove.

Then the semiconductor laser device is provided with reflection films having a reflectance no more than 50% and that no less that 90% at two resonator end faces respectively, and thus asymentrically coated to obtain a steady basic transverse mode oscillation when the device is operated at a high output of no less than 30 mW. Then, die-bonding is employed to mount a laser chip on a heat sink to obtain a semiconductor laser device. The heat sink referred to herein includes a stem or the like.

Various characteristics of the semiconductor laser device fabricated as above were estimated. When a direct current was supplied, the semiconductor laser device started lasing at a threshold current of 30 mA. A lasing wavelength measured with a spectrum analyzer was 405 nm±10 nm. Then the obtained semiconductor laser device was used as a light source for an optical disk to examine its noise characteristics for optical feedback. It is known that continuously oscillating laser provides an unsteady output attributed to interference with optical feedback reflected from the optical desk. Accordingly, to enable a laser device to have low-noise characteristics, it is desired to cause self-pulsation at a particular cycle. The noise at an optical output of 5 mW and optical feedback of 0.1% to 10% was found to be no more than RIN (relative intensity noise)=−127 dB/Hz. Then, when noise characteristics at a low output were examined, a similar noise level of no more than −130 dB/Hz was obtained at an optical output of about 1 mW. Thus it has been found that the semiconductor laser device of the present invention is suitably applicable to an optical disk system of low power consumption.

For comparison, the above described structure with nitride-based semiconductor layer 19 replaced with an InGaN layer was used to provide a semiconductor laser device and examine its characteristics. The noise at an optical output of 5 mW was no more than −125 dB/Hz, whereas that at a low output of 1 mW was no less than −110 dB/Hz, and it was found that the laser device is not suitably applicable to optical disk systems.

Nitride-based semiconductor layer 19 for saturable absorption can comprise GaNAs to obtain a satisfactory semiconductor laser, as described hereinbefore, for the following reason. Heavy holes in GaNAs have small effective mass which is much smaller than in InGaN in particular. When heavy holes are light, a semiconductor comprising GaNAs has a band structure with a valence band having an upper end in a sharp curvature, resulting in a small state density of the valence band absorbing photons slightly larger in energy than the bandgap. In other words, for a large number of photons, absorption is readily saturated. A semiconductor laser including nitride-based semiconductor layer 19 containing GaNAs causes saturable absorption even at smaller optical output and it can thus have self-pulsation characteristics.

The optical output causing self-pulsation can be controlled by thickness and position in arrangement of the nitride-based semiconductor layer for saturable absorption. Meanwhile, since an absorption layer of a material inherently having inferior saturable characteristic must be reduced in thickness, it would also result in a reduced amount of light absorbed. In such case, a good saturable absorption characteristic can hardly be obtained.

Other than the self-pulsation characteristics as described above, a good threshold current characteristic and the like can also be obtained by the semiconductor laser of the first embodiment. On the other hand, if a clad layer has therein an absorption layer of InGaN having a significantly different bandgap, as conventional, a lattice mismatch therebetween increases lattice defects. In particular, if a p-clad layer is impaired in crystallinity, effect of Mg dopant would be compensated for and high resistance would thus be caused and then lattice defects may cause uneven current injection, impaired transverse mode oscillation, and the like. A GaNAs layer formed inside nitride-based semiconductor layer 19 causes the energy band to significantly bow at its small amount of As. Thus, even when the lattice mismatch is small, a sufficiently small bandgap can be obtained. Herein, the GaNAs layer preferably has a bandgap width equal to or slightly smaller than that of the active layer. From the above effects, the laser device of the first embodiment could maintain good crystalinity of the clad layer and achieve uniform current injection and provide satisfactory transverse mode characteristics.

The nitride semiconductor laser structure of the first embodiment overlies GaN substrate 11 as shown in FIG. 1. Nitride-based semiconductor layers grown over the GaN substrate 11 have a cleavage plane matching that of the substrate and thus in the aforementioned chip division process a good cleaved plane can be obtained. With good resonator end faces, the semiconductor laser device of the first embodiment can bring about end face reflection effect as designed to cause steady self-pulsation. Furthermore, a high yield of low-noise nitride semiconductor laser can be obtained.

Figure 13:
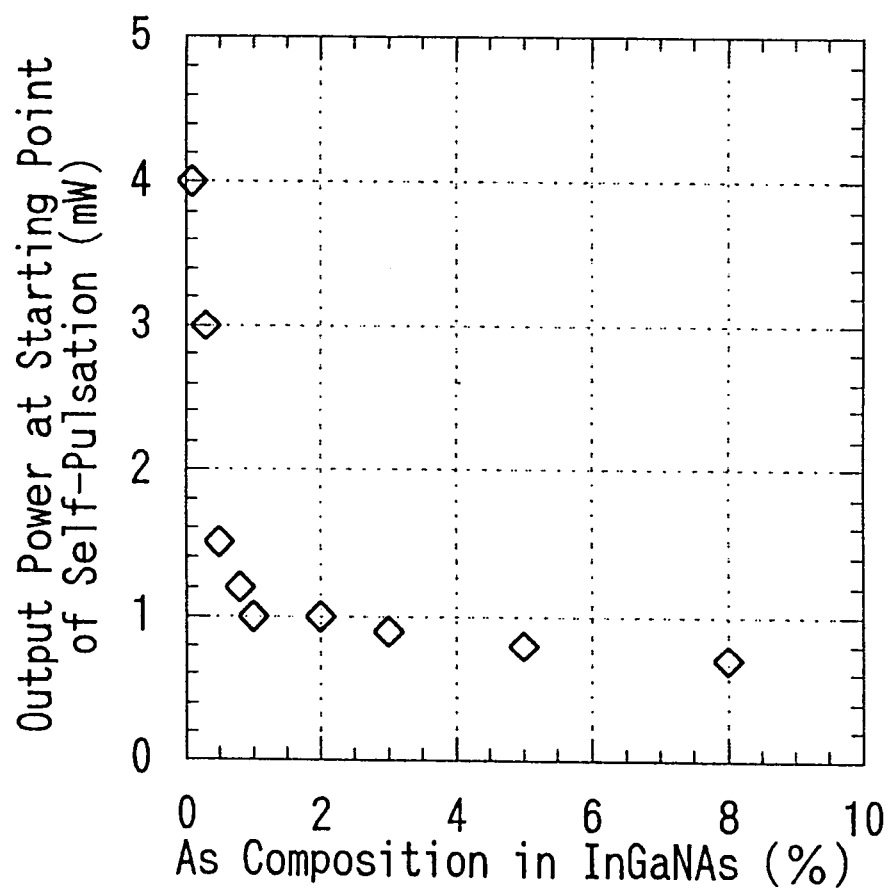
FIG. 13 is a graph showing relationship between the As content of the InGaNAs layer in a semiconductor laser and the self-pulsation characteristic of the laser.

Then, nitride-based semiconductor layer 19 with GaNAs replaced with InGaNAs was used to examine how different amounts of As mixed affect self-pulsation characteristics. Mixing a small amount of In, As or the like with GaN acts to reduce the bandgap. As mentioned above, to obtain good saturable absorption, the amount of As to be mixed was examined. As is apparent from the result shown in FIG. 13, when As of no less than 0.5 atomic % is contained, there can be provided a semiconductor laser device capable of self-pulsing even at low output.

Then the ridge was altered in depth to examine how it affects the device. As a result, although a slight change was observed in a far filed pattern (FFP), there was not observed any negative effect on self-pulsation characteristics. The bottom of the ridge may have any position between p-GaN guide layer 17 and nitride-based semiconductor layer 19.

In the FIG. 1 structure, nitride-based semiconductor layer 19 (a layer for saturable absorption) is vertically sandwiched by p-AlGaN clad layers 18 and 20 which may have a composition different from each other and one of which may be dispensed with. Furthermore, the layer for saturable absorption provided inside a p-AlGaN clad layer may alternatively be provided inside an n-AlGaN clad layer. The two n-AlGaN clad layers vertically sandwiching the layer for saturable absorption may be different in composition and one of the two clad layers may be dispensed with. Furthermore, the layer for saturable absorption may be provided inside a p- or n-GaN guide layer. The two guide layers vertically sandwiching the layer for saturable absorption may different in composition and one of the two guide layers may be dispensed with.

Furthermore, if the active layer of the first embodiment alternatively includes InGaN, InGaNAs, or InGaNAsP, setting its bandgap to be substantially equal to GaNAs prevents saturable absorption characteristics from varying and thus provides satisfactory self-pulsation.

Figure 3:
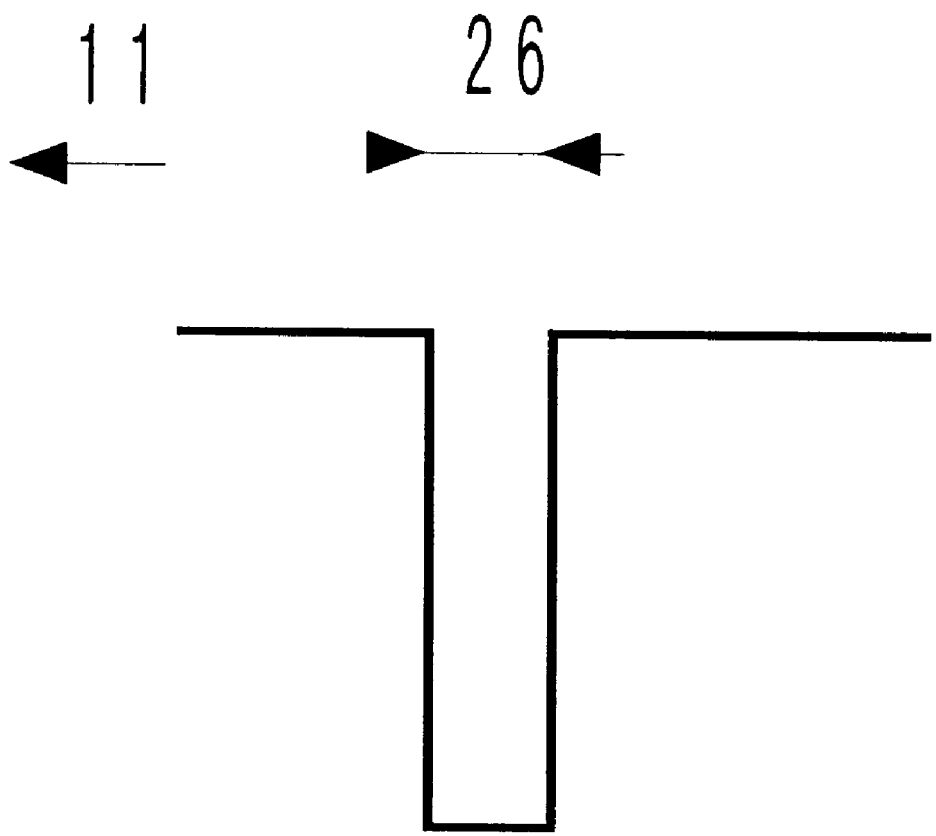
FIG. 3 is an energy level diagram representing another nitride-based semiconductor layer for saturable absorption.
Figure 4:
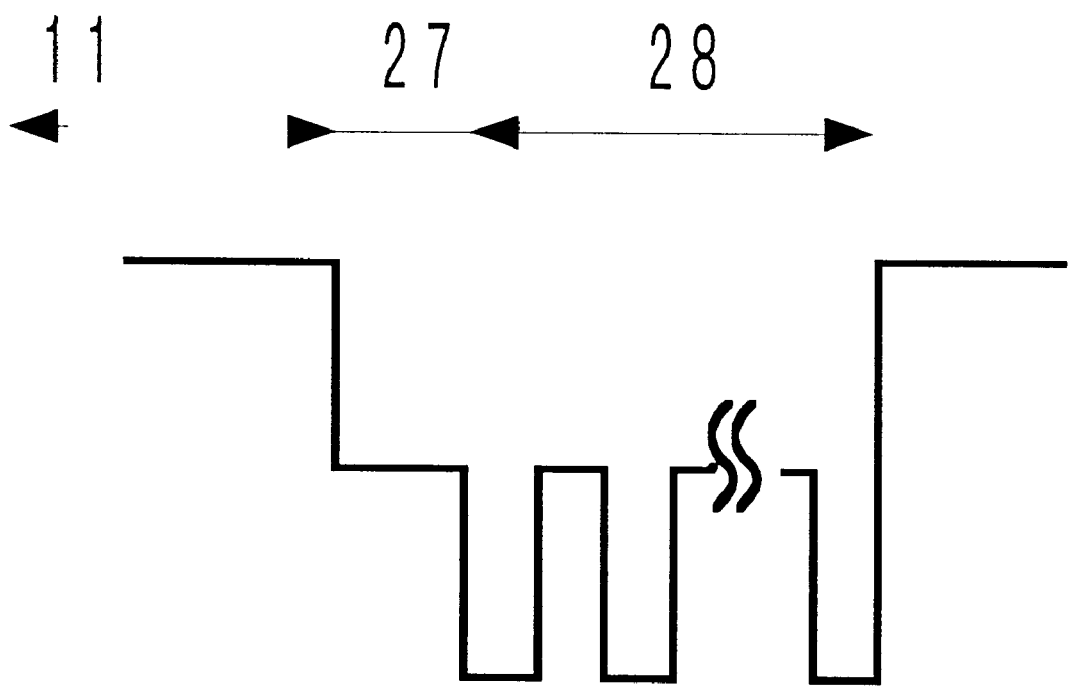
FIG. 4 is an energy level diagram representing still another nitride-based semiconductor layer for saturable absorption.

Nitride-based semiconductor layer 19 may have a structure, such as a monoquantum well layer without an optical guide layer as shown in FIG. 3, a multiquantum well layer 28 with an optical guide layer 27 as shown in FIG. 4, a multiquantum well layer without an optical guide layer, a multiquantum well layer with an optical guide layer, or a distorted multiquantum well layer without an optical guide layer. These structures were also expected to have a substantially similar effect and then a lasing threshold of 30 to 50 mA and self-pulsation starting at lower output were confirmed from results of experiments.

More specifically, FIG. 3 schematically shows a conduction band energy structure of nitride-based semiconductor layer 19 having a configuration different from FIG. 2, illustrating the lower limit level of the conduction band in p-AlGaN clad layer 18, p-GaNAs monoquantum well layer 26 corresponding to nitride-based semiconductor layer 19, and p-AlGaN clad layer 20, as seen from substrate 11.

FIG. 4 schematically shows a conduction band energy structure of nitride-based semiconductor layer 19 having still another structure, illustrating the lower limit level of a conduction band in p-AlGaN clad layer 18, p-GaN optical guide layer 27, p-GaNAs multiquantum well layer 28 and p-AlGaN clad layer 20, as seen from GaN substrate 11. More specifically, nitride-based semiconductor layer 19 includes p-GaN optical guide layer 27 and p-GaNAs multiquantum well layer 28.

Second Embodiment

Figure 5:
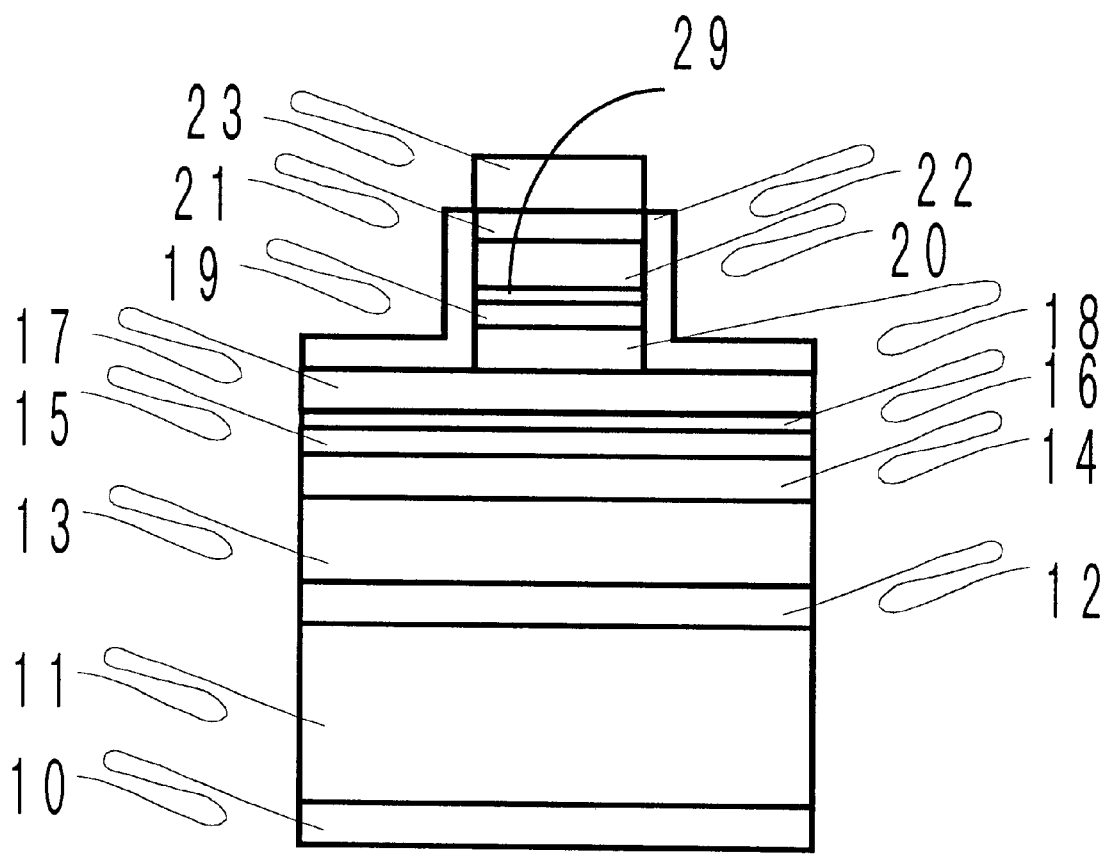
FIGS. 5–8 schematically show semiconductor laser devices of second to sixth embodiments, respectively, of the present invention.

FIG. 5 shows a semiconductor laser device of a second embodiment of the present invention including nitride-based semiconductor layer 19 for saturable absorption covered with a protection layer 29 of AlGaN. The remainder of the structure is similar to the first embodiment. As shown in FIG. 5, n electrode 10 is provided on a back surface of 10 GaN substrate 11. Successively provided on a front surface of GaN substrate 11 are n-GaN buffer layer 12, n-AlGaN clad layer 13, n-GaN guide layer 14, GaNAs active layer 15, AlGaN ant-vaporization layer 16, p-GaN guide layer 17, p-AlGaN clad layer 18, nitride-based semiconductor layer for saturable absorption 19, AlGaN protection layer 29, p-AlGaN clad layer 20, p-GaN contact layer 21, insulation film 22, and p electrode 23.

AlGaN clad layers 18 and 20 of a p type are epitaxially grown at a high temperature. As such, it is sometimes difficult to grow the clad layer on a thin saturable absorption containing a precisely controlled small amount of As, P or the like without changing the characteristics of the saturable absorption layer. Accordingly, AlGaN protection layer 29 is formed on nitride-based semiconductor layer 19 for saturable absorption and then p-AlGaN clad layer 20 is formed thereover. Protection layer 29 is grown at a lower temperature as compared with clad layer 20. Protection layer 29 can prevent a volatile constituent of As, P or Sb from dissipating during growth of clad layer 20 and can thus prevent nitride-based semiconductor layer 19 from changing in composition and characteristics.

The semiconductor laser of the second embodiment is fabricated in a similar process as the first embodiment, except that protection layer 29 is grown at a low temperature. The semiconductor laser of the second embodiment thus obtained was estimated and a result was obtained, as follows. Table 1 shows errors between actual values of optical outputs causing good self-pulsation and designed values thereof. It is understood from Table 1 that protection layer 29 acts to reduce the errors. The protection layer enables to provide a semiconductor laser device capable of self-pulsing in a controlled condition and also serves to increase the yield of optical disk systems which use the semiconductor laser as a light source. The semiconductor laser of the second embodiment has substantially similar general characteristics of lasing threshold value, FFP and the like as the first embodiment.

TABLE 1

| | Protection Layer Provided | Protection Layer Not Provided |
|---|---|---|
| Offset in PL wavelength from designed value | ±4 nm | ±10 nm |
| Offset in output at which self pulsation starts (at 5 mW) | ±1 mW | ±1.5 mW |
| Yield (Reference: no protection layer) | 1.8 | 1 |

Third Embodiment

A third embodiment provides a semiconductor laser device similar as described in the first or second embodiment, though nitride-based semiconductor layer 19 contains GaNP rather than GaNAs. It is fabricated in a process similar to that of the first embodiment, except that a source material of $AsH_3$ is replaced with $PH_3$. In this process, P is mixed in an amount adjusted to be 1 to 12 atomic % in group V elements. The resultant semiconductor laser device was evaluated regarding its characteristics. Its lasing threshold and lasing wavelength were 34 mA and 400 nm±10 nm, respectively, controlled successfully. At an optical output of 5 mW and a quantity of optical feedback of 0.1% to 10%, its relative noise intensity was no more than −126 dB/Hz. Furthermore it was also confirmed that laser device of the third embodiment with a protection layer similar to that in the second embodiment serves to increase the yield of the optical desk systems.

Self-pulsation characteristics were estimated regarding a laser device in which InGaNP replaced GaNAs of nitride-based semiconductor layer 19 of the first or second embodiment and it was found that the laser device containing P of no less than 0.6 atomic % causes good self-pulsation.

Furthermore, it was found that when the active layer of the third embodiment alternatively comprised InGaN, InGaNAs, or InGaNAsP, and had its bandgap substantially equal to that of GaNP, saturable absorption characteristics were not substantially changed and good self-pulsation could be obtained.

Forth Embodiment

Figure 6:
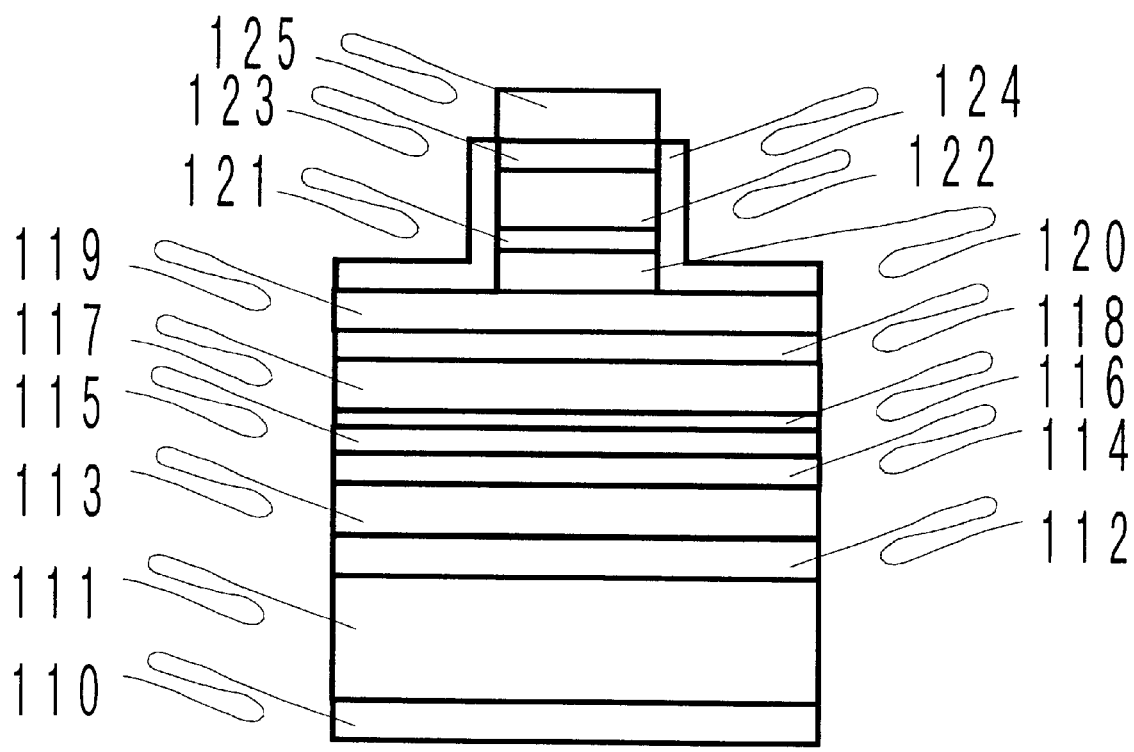

FIG. 6 schematically shows a semiconductor laser device in a forth embodiment of the present invention. In FIG. 6, a GaN substrate 111 has a back surface provided with an n electrode 110 and a front surface provided with an n-GaN buffer layer 112, an n-AlGaN clad layer 113, an n-GaN guide layer 114, an InGaNAsP active layer 115, an AlGaN ant-vaporization layer 116, a p-GaN guide layer 117, a first nitride-based semiconductor layer for saturable absorption 118, a p-GaN guide layer 119, a p-AlGaN clad layer 120, a second nitride-based semiconductor layer for saturable absorption 121, a p-AlGaN clad layer 122, a p-GaN contact layer 123, an insulation film 124, and a p electrode 125. As seen in FIG. 6, a ridge structure is formed closer to the p electrode to narrow electric current distribution introduced into the active layer.

The first and second nitride-based semiconductor layers 118 and 121 are specifically shown in FIG. 2, with the conduction band energy level having the distribution similar to that described in the first embodiment. The first and second nitride-based semiconductor layers 118 and 121 each include p-GaN optical guide layer 24 and p-InGaNAsP monoquantum well layer 25 arranged successively as seen from the GaN substrate. The first and second nitride-based semiconductor layers 118 and 121 have their bandgaps substantially as small as that of active layer 115 and then optical guide layer 24 enables efficient confinement of light emitted from active layer 115 to facilitate light absorption.

The semiconductor laser device of the fourth embodiment is fabricated, similarly as described in the first embodiment. When the obtained laser device received a direct current, it started lasing at a threshold value of 35 mA. A spectrum analyzer was used to measure the lasing wavelength, which was 405 nm±10 nm.

Then the obtained semiconductor laser device was used as a light source in an optical disk system to examine its noise characteristics for optical feedback. It is known that continuously oscillating laser provides an unsteady output attributed to interference with optical feedback reflected from an optical disk. Accordingly, to enable a laser device to have low-noise characteristics, it is desired to cause self-pulsation having a particular cycle. The noise at an optical output of 5 mW and optical feedback of 0.1% to 10% was found to be no more than −130 dB/Hz. Then, the device's noise characteristics at a low output were examined. More specifically, a similar noise level of no more than −130 dB/Hz was obtained at an optical output of about 1 mW and thus the laser device of the present embodiment was found suitably applicable to optical disk systems of low power consumption. Furthermore the device was examined for noise characteristics at a high output. An optical output of about 30 mW caused a similar noise level of no more than −128 dB/Hz and thus the laser device was sufficiently useable for writing information, such as recording images, sounds and the like, in optical disk systems.

At low output, the semiconductor laser device internally has a greater light distribution at the first nitride-based semiconductor layer 118 and since the layer contains InGaNAsP facilitating saturable absorption, i.e., the first nitride-based semiconductor layer 118 causes saturable absorption effect, the laser device starts self-pulsation. At high output, an effect of carriers injected alters the carrier distribution in the semiconductor laser device and also increases the light distribution at the second nitride-based semiconductor layer 121. Thus the first and second nitride-based semiconductor layers both have saturable absorption effect contributing to self-pulsation. The semiconductor laser device was thus capable of self-pulsing at low output through high output.

The nitride-based semiconductor layer for saturable absorption may includes an n-GaN optical guide layer and an n-InGaNAs monoquantum well layer. In this case, a single nitride-based semiconductor layer for saturable absorption may be provided inside an n layer (e.g., an n-clad layer or an n-guide layer) or in contact with an n-layer (e.g., an n-clad layer or an n-guide layer) or two nitride-based semiconductor layers for saturable absorption may be provided similarly. More specifically, providing a layer for saturable absorption on the n layer side can be as effective as providing it on the p layer side. Furthermore, as described in the second embodiment, there may be included a protection layer covering the layer for saturable absorption. The use of the protection layer increases the yield of the laser devices.

Fifth Embodiment

Figure 7:
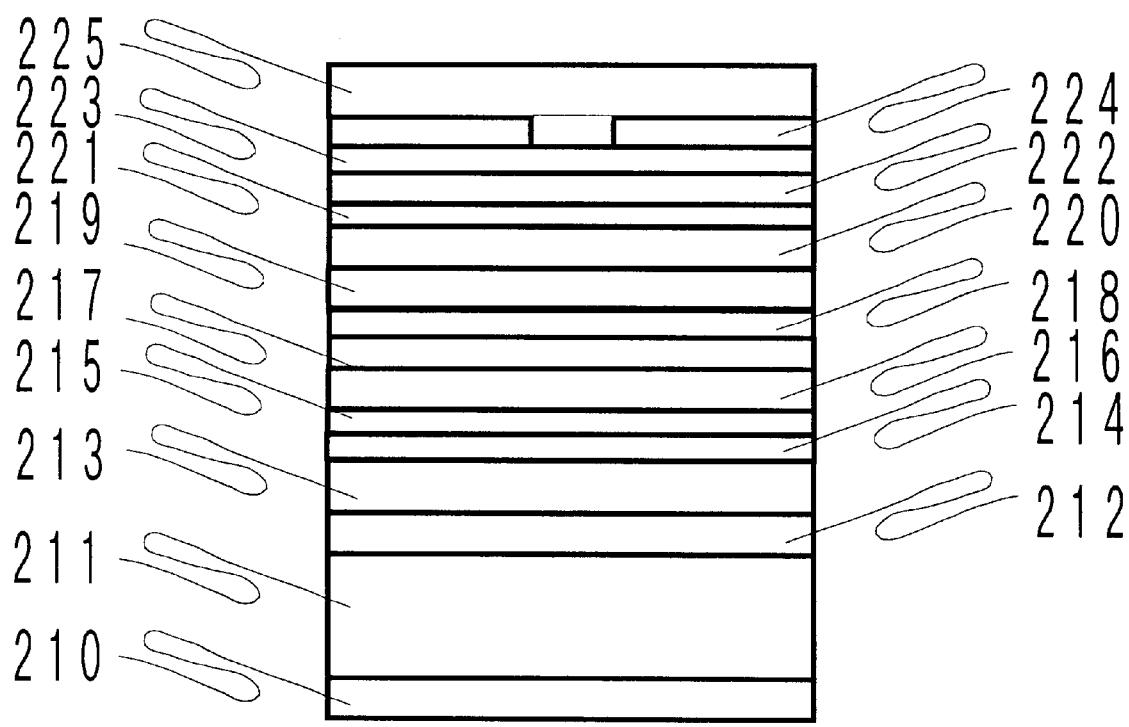

FIG. 7 schematically shows a semiconductor laser device of a fifth embodiment of the present invention. In FIG. 7, a GaN substrate 211 has a back surface provided with an n electrode 210 and a front surface provided with an n-GaN buffer layer 212, an n-AlGaN clad layer 213, a first nitride-based semiconductor layer for saturable absorption 214, an n-AlGaN clad layer 215, an n-GaN guide layer 216, an InGaNAsP active layer 217, an AlGaN ant-vaporization layer 218, a p-GaN guide layer 219, a p-AlGaN clad layer 220, a second nitride-based semiconductor layer for saturable absorption 221, a p-AlGaN clad layer 222, a p-GaN contact layer 223, an insulation film 224, and a p electrode 225. Furthermore, as seen in FIG. 7, a stripe electrode structure is formed regarding the p electrode to narrow electric current distribution introduced into the active layer.

The first and second nitride-based semiconductor layers 214 and 221 for saturable absorption are specifically shown in FIG. 2, with their conduction band energy levels having distribution similar to that described in the first embodiment. The first and second nitride-based semiconductor layers 214 and 221 each include p-GaN optical guide layer 24 and p-InGaNAsP monoquantum well layer 25 arranged successively as seen from the GaN substrate. The first and second nitride-based semiconductor layers 214 and 221 have their bandgaps substantially as small as that of active layer 217 and then the optical guide layer enables efficient confinement of light emitted from the active layer to facilitate light absorption. The first and second nitride-based semiconductor layers 214 and 221 are positioned symmetrically with respect to active layer 217.

The semiconductor laser device of the fifth embodiment is fabricated, similarly as described in the first embodiment. When the obtained laser device received a direct current, it started lasing at a threshold value of 32 mA. A spectrum analyzer was used to measure the lasing wavelength, which was 405 nm±10 nm.

Then the obtained semiconductor laser device was used as a light source for an optical disk to examine its noise characteristics for optical feedback. It is known that continuously oscillating laser provides an unsteady output attributed to interference with optical feedback reflected from the optical disk. Accordingly, to enable a laser device to have low-noise characteristics, it is desired to provide self-pulsation having a particular cycle. The noise at an optical output of 5 mW and optical feedback of 0.1% to 10% was found to be no more than −130 dB/Hz. Then, the device's noise characteristics at a low output were examined. More specifically, a similar noise level of no more than −127 dB/Hz was obtained at an optical output of about 1 mW and thus the laser device of the present embodiment was also found suitably applicable to optical disk systems of low power consumption.

Furthermore the laser device of the fifth embodiment was also examined regarding its near field pattern (NFP) and then its beam pattern was found satisfactory, providing an improved aspect ratio as compared with the first embodiment when beam is focused via a lens. This improvement contributes to cost reduction as it can reduce the number of the components of an optical system when the laser device is applied to an optical disk system. The NFP improved because nitride-based semiconductor layers 214 and 221 for saturable absorption symmetrically overlying and underlying active layer 217 enable the semiconductor laser device to internally have symmetrical light distribution. Thus, a plurality of nitride-based semiconductor layers of InGaNAsP for saturable absorption symmetrically overlying and underlying an active layer enable a semiconductor laser device to self-pulse even at low output and also provide a superior beam pattern.

The laser device of the fifth embodiment, as well as that of the second embodiment, may have a protection layer covering a layer for saturable absorption. The use of the protection layer increases the yield of the laser device. Furthermore while the fifth embodiment employs a stripe electrode structure to narrow electric current distribution, it may alternatively employ the ridge structure.

Sixth Embodiment

Figure 8:
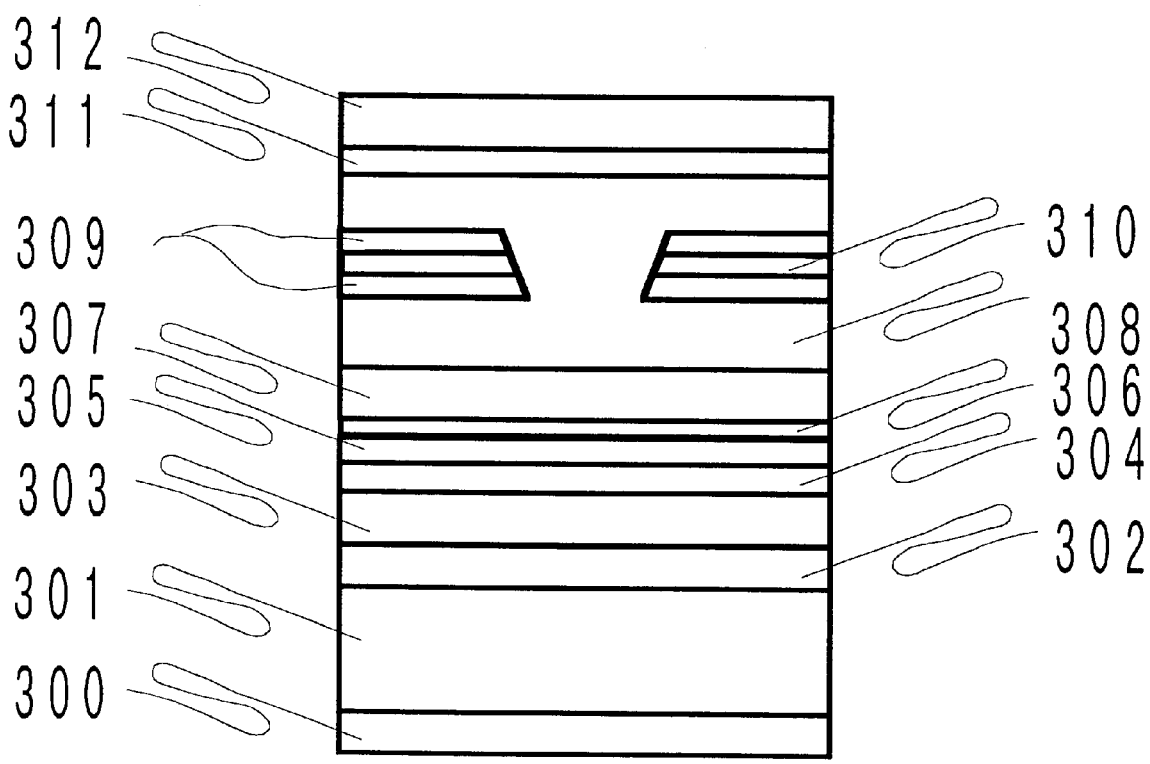

FIG. 8 schematically shows a semiconductor laser device in a sixth embodiment of the present invention. In FIG. 8, a GaN substrate 301 has a back surface provided with an N electrode 300 and a front surface provided with an n-GaN buffer layer 302, an n-AlGaN clad layer 303, an n-GaN guide layer 304, a GaNAs active layer 305, an AlGaN ant-vaporization layer 308, a p-GaN guide layer 307, a p-AlGaN clad layer 308, an n-AlGaN block layer 309, a nitride-based semiconductor layer for saturable absorption 310, a p-GaN contact layer 311, and a p electrode 312. N-block layer 309 arranged inside p layer 308 narrows electric current distribution introduced into active layer 305.

Nitride-based semiconductor layer for saturable absorption 310 is configured, as shown in FIG. 2, including p-GaN optical guide layer 24 and p-GaNAs monoquantum well layer 25 arranged successively, as seen from the GaN substrate. Nitride-based semiconductor layer 310 has a bandgap substantially as small as that of active layer 305 and then optical guide layer 24 enables efficient confinement of light emitted from the active layer to facilitate light absorption.

The semiconductor laser device of the sixth embodiment is fabricated, similarly as described in the first embodiment. When the obtained laser device received a direct current, it started lasing at a threshold value of 25 mA. A spectrum analyzer was used to measure the lasing wavelength, which was 405 nm±10 nm.

Then the obtained semiconductor laser device was used as a light source for an optical disk to examine its noise characteristics for optical feedback. It is known that continuously oscillating laser provides an unsteady output attributed to interference with optical feedback reflected from the optical disk. Accordingly, to enable a laser device to have low-noise characteristics, it is desired to provide self-pulsation having a particular cycle. The noise at an optical output of 5 mW and optical feedback of 0.1% to 10% was found to be no more than −132 dB/Hz. Then, the device's noise characteristics at a low output were examined. More specifically, a similar noise level of no more than −128 dB/Hz was obtained at an optical output of about 1 mW and the laser device of the present embodiment was also found suitably applicable to optical disk systems of low power consumption.

The nitride-based semiconductor layer for saturable absorption in the sixth embodiment was studied in terms of position, structure and number and then it was found substantially as effective as the first to forth embodiments to adopt any of a monoquantum well layer without an optical guide layer, a multiquantum well layer with an optical guide layer, a multiquantum well layer without an optical guide layer, a distorted multiquantum well layer with an optical guide layer, and a distorted multiquantum well layer without an optical guide layer. Furthermore, the layer for saturable absorption may be positioned inside a p-clad layer, at a boundary of an n-block layer and p-clad layer, inside a p- or n-guide layer, or inside an n-clad layer. Two saturable absorption layers may be provided, as described in the forth embodiment, enabling a nitride-based semiconductor laser device to cause self-pulsation even at low output. Furthermore, there may be provided a protection layer covering a saturable absorption layer, as described in the second embodiment. The use of the protection layer increases the yield of the laser device.

Seventh Embodiment

Figure 9:
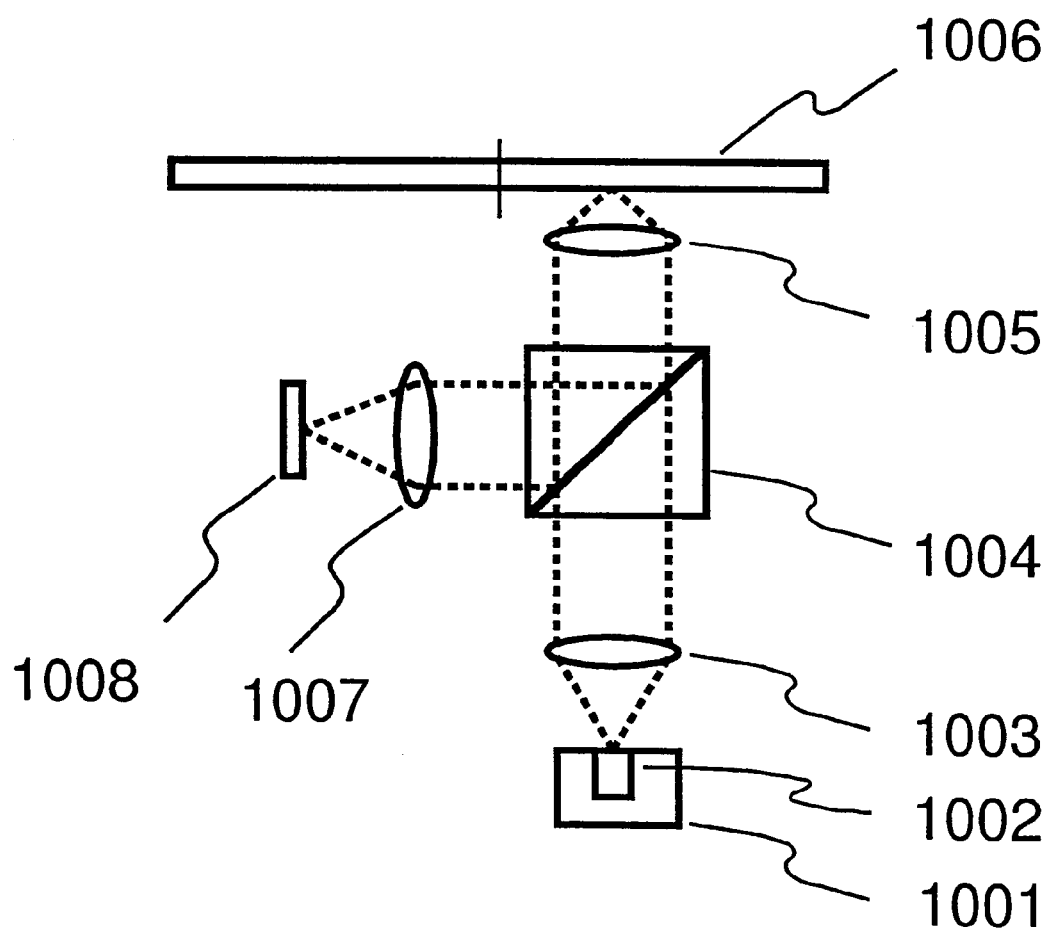
FIG. 9 is a block diagram showing an optical information reproduction apparatus of a seventh embodiment of the present invention.

In a seventh embodiment, the semiconductor laser devices of the first to sixth embodiments were evaluated regarding their respective characteristics when they were used as a light source for an optical disk. FIG. 9 shows an optical information reproduction apparatus of the seventh embodiment of the present invention. This apparatus includes a base 1001, a semiconductor laser device 1002 arranged on the base, a collimator lens 1003, a beam splitter 1004, an objective lens 1005, a lens 1007 condensing reflected light, and a photodetector 1008 for detecting condensed light.

In the FIG. 9 apparatus, semiconductor laser device 1002 outputs laser light which is in turn collimated or substantially collimated by collimator lens 1003 and transmitted through beam splitter 1004 and focused by objective lens 1005 on an information recording surface of optical disk 1006. The information recording surface has bit information written thereon by pits, magnetic modulation, or refraction index modulation. The focused laser light is reflected from the disk and directed through objective lens 1005 and branched by beam splitter 1004 and condensed on photodetector 1008 by lens 1007. Photodetector 1008 optically detects a signal that is in turn converted to an electrical signal to read recorded information.

When the laser device of the first embodiment is used in the optical information reproduction apparatus, laser light is focused by objective lens 1005 on the information recording surface of optical disk 1006 with high resolution. As a result, information written with a high density as 5M/mm$^2$ on the optical disk could be read with a bit error rate of 10$^{-6}$. By contrast, when such a semiconductor laser device including an InGaN saturable absorption layer as the comparative example in the first embodiment was used as semiconductor laser device 1002 in FIG. 9, information was read with a bit error rate of 10$^{-3}$ and the laser device was not suitable for practical application. Thus an optical information reproduction apparatus using the semiconductor laser device of the present invention can read information with low noise and hence at a low error rate from a high-density optical disk.

When the laser device of the second, third, fourth, fifth or six embodiment instead of the first embodiment was used in the FIG. 9 apparatus, a bit error late of 10$^{-5}$ to 10$^{-7}$ was achieved for any of the laser devices and it was found that the apparatus can read information at a low noise level with the laser device.

While mixing a small amount of As and/or P with a nitride-based semiconductor layer for saturable absorption can provide a laser device with satisfactory threshold characteristics and self-pulsation characteristics, mixing Sb therewith is similarly effective. Preferably, Sb of about 1 to 5 atomic % is introduced into the nitride-based semiconductor layer for saturable absorption.

Thus, in the present invention, a gallium-nitride-based semiconductor layer containing at least one element selected from the group consisting of As, P and Sb to cause saturable absorption, enable to provide a semiconductor laser device capable of self-pulsing even at low output. The semiconductor laser device of the present invention can be operated with a power consumption smaller than conventional and also have its lifetime longer than conventional. The laser device of the present invention is particularly suitable for a light source in an optical disk system. An information reproduction apparatus using the present laser device can read information of high density with low noise.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device having a semiconductor stacked-layer structure including a plurality of gallium-nitride-based semiconductor layers, said semiconductor stacked-layer structure comprising:

an active layer sandwiched by layers of large bandgap energy larger than the bandgap energy of said active layer; and a saturable absorption layer of a gallium-nitride-based semiconductor containing at least one element selected from the group consisting of As, P and Sb, and provided at a location apart from said active layer and inside or in contact with one of said layers of large bandgap energy, said layer greater in bandgap energy than said active layer being one of a clad layer and an optical guide layer.

2. The semiconductor laser device of claim 1, wherein said saturable absorption layer forms a quantum well structure.

3. The semiconductor laser device of claim 1, wherein said saturable absorption layer causes self-pulsation attributed to saturable absorption effect.

4. The semiconductor laser device of claim 1, wherein said saturable absorption layer is formed of gallium-nitride-based semiconductor represented by an expression $Al_xIn_yGa_{1-x-y}N_{1-p-q-r}As_pP_qSb_r$, where $0 \leq x$, $0 \leq y$, $x+y<1$, $0 \leq p$, $0 \leq q$, $0 \leq r$, and $0.001 \leq p+q+r \leq 0.5$.

5. The semiconductor laser device of claim 4, wherein in said expression, $q+r=0$ and $0.005 \leq p$.

6. The semiconductor laser device of claim 5, wherein in said expression, $q+r=0$ and $0.006 \leq q$.

7. The semiconductor laser device of claim 1, further comprising an AlGaN layer covering said saturable absorption layer.

8. The semiconductor laser device of claim 1, wherein said stacked-layer structure is formed on a GaN substrate.

9. The semiconductor laser device of claim 1, wherein said saturable absorption layer is lower in crystalinity than said layer greater in bandgap energy than said active layer.

10. A semiconductor laser device having a semiconductor stacked-layer structure including a plurality of gallium-nitride-based semiconductor layers, said semiconductor stacked-layer structure comprising:

an active layer sandwiched by layers of large bandgap energy larger than the bandgap energy of said active layer; and a layer of a gallium-nitride-based semiconductor containing at least one element selected from the group consisting of As, P and Sb, having a peak wavelength of photoluminescence within ±20 nm compared with the photoluminescence of said active layer, and provided at a location apart from said active layer and inside or in contact with one of said layers of large bandgap energy, said layer greater in bandgap energy than said active layer is one of a clad layer and an optical guide layer.

11. The semiconductor laser device of claim 10, wherein said saturable absorption layer forms a quantum well structure.

12. The semiconductor laser device of claim 10, wherein said saturable absorption layer causes self-pulsation attributed to saturable absorption effect.

13. The semiconductor laser device of claim 10, wherein said saturable absorption layer is formed of gallium-nitride-based semiconductor represented by an expression $Al_xIn_yGa_{1-x-y}N_{1-p-q-r}As_pP_qSb_r$, where $0 \leq x$, $0 \leq y$, $x+y<1$, $0 \leq p$, $0 \leq q$, $0 \leq r$, and $0.001 \leq p+q+r \leq 0.5$.

14. The semiconductor laser device of claim 13, wherein in said expression, $q+r=0$ and $0.005 \leq p$.

15. The semiconductor laser device of claim 13, wherein in said expression, $q+r=0$ and $0.006 \leq q$.

16. The semiconductor laser device of claim 13, further comprising an AlGaN layer covering said saturable absorption layer.

17. The semiconductor laser device of claim 13, wherein said stacked-layer structure is formed on a GaN substrate.

18. The semiconductor laser device of claim 13, wherein said saturable absorption layer is lower in crystalinity than said layer greater in bandgap energy than said active layer.

* * * * *

UNITED STATES PATENT AND TRADEMARK OFFICE
CERTIFICATE OF CORRECTION

PATENT NO. : 6,735,231 B2
DATED : May 11, 2004
INVENTOR(S) : Tomoki Ono et al.

It is certified that error appears in the above-identified patent and that said Letters Patent is hereby corrected as shown below:

Column 15,
Line 14, delete "5" and insert -- 4 -- in place thereof;

Column 16,
Lines 23, 26 and 28, delete "13" and insert -- 10 -- in place thereof.

Signed and Sealed this

Twenty-eighth Day of September, 2004

JON W. DUDAS
*Director of the United States Patent and Trademark Office*